United States Patent
Yu et al.

(10) Patent No.: US 6,451,656 B1
(45) Date of Patent: Sep. 17, 2002

(54) CMOS INVERTER CONFIGURED FROM DOUBLE GATE MOSFET AND METHOD OF FABRICATING SAME

(75) Inventors: Bin Yu, Cupertino, CA (US); William G. En, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/796,283

(22) Filed: Feb. 28, 2001

(51) Int. Cl.$^7$ .............................. H01L 21/336
(52) U.S. Cl. ................ 438/283; 438/199; 438/275; 438/311
(58) Field of Search ................ 438/275, 199, 438/283, 311

(56) References Cited

U.S. PATENT DOCUMENTS

| | | | |
|---|---|---|---|
| 4,803,181 A | * | 2/1989 | Buchmann et al. |
| 4,931,137 A | * | 6/1990 | Sibuet |
| 5,273,921 A | | 12/1993 | Neudeck et al. |
| 5,349,228 A | | 9/1994 | Neudeck et al. |
| 5,376,561 A | | 12/1994 | Vu et al. |
| 5,382,816 A | | 1/1995 | Mitsui |
| 5,409,850 A | | 4/1995 | Tsuji |
| 5,480,838 A | | 1/1996 | Mitsui |
| 5,702,963 A | | 12/1997 | Vu et al. |
| 5,739,057 A | | 4/1998 | Tiwari et al. |
| 5,841,170 A | | 11/1998 | Adan et al. |
| 5,918,132 A | * | 6/1999 | Qian et al. ............... 438/299 |
| 5,923,981 A | * | 7/1999 | Qian ......................... 438/284 |
| 6,022,815 A | * | 2/2000 | Doyle et al. ............. 438/947 |
| 6,049,496 A | | 4/2000 | Forbes et al. |
| 6,060,754 A | | 5/2000 | Noble et al. |
| 6,063,686 A | | 5/2000 | Masuda et al. |
| 6,074,899 A | | 6/2000 | Voldman |
| 6,075,272 A | | 6/2000 | Forbes et al. |
| 6,091,654 A | | 7/2000 | Forbes et al. |
| 6,097,065 A | | 8/2000 | Forbes et al. |
| 6,103,605 A | * | 8/2000 | Hopper ...................... 438/585 |
| 6,104,066 A | | 8/2000 | Noble et al. |
| 6,107,663 A | | 8/2000 | Noble et al. |
| 6,143,582 A | | 11/2000 | Vu et al. |
| 6,165,828 A | | 12/2000 | Forbes et al. |
| 6,255,182 B1 | * | 7/2001 | Wieczorek et al. ......... 438/305 |
| 6,342,410 B1 | * | 1/2002 | Yu ............................. 438/164 |
| 6,391,753 B1 | * | 5/2002 | Yu |

OTHER PUBLICATIONS

Sub 50–nm FinFET: PMOS (revised Dec. 9, 1999), Huang, et al., Dept, Of Electrical Engineering and Computer Sciences, Univ. of California at Berkeley, CA 94720 USA.

* cited by examiner

*Primary Examiner*—Long Pham
(74) *Attorney, Agent, or Firm*—Renner, Otto, Boisselle & Sklar, LLP

(57) ABSTRACT

A method of forming a semiconductor line from a semiconductor-on-insulator (SOI) wafer, the SOI wafer having a substrate with a buried oxide (BOX) layer disposed thereon and a semiconductor active layer disposed on the BOX layer. The method includes the steps of (a) forming a dummy island on the active layer; (b) forming a sidewall spacer adjacent the dummy island; (c) removing the dummy island; (d) removing semiconductor material of the active layer left exposed by the sidewall spacer; and (e) removing the sidewall spacer.

20 Claims, 4 Drawing Sheets ic circuits for digital circuitry. Such digital circuitry is typically made from partially-depleted metal oxide semiconductor field effect transistors (MOSFETs). In such circuits, dielectric isolation and reduction of parasitic capacitance improve circuit performance, and virtually eliminate latch-up in CMOS circuits. In addition, circuit layout in SOI can be greatly simplified and the packing density greatly increased.

However, there exists a need in the art to efficiently fabricate logical circuit elements, such as inverters, from SOI active devices.

SUMMARY OF THE INVENTION

According to one aspect of the invention, the invention is a method of forming a semiconductor line from a semiconductor-on-insulator (SOI) wafer, the SOI wafer having a substrate with a buried oxide (BOX) layer disposed thereon and a semiconductor active layer disposed on the BOX layer. The method includes the steps of (a) forming a dummy island on the active layer; (b) forming a sidewall spacer adjacent the dummy island; (c) removing the dummy island; (d) removing semiconductor material of the active layer left exposed by the sidewall spacer; and (e) removing the sidewall spacer.

According to another aspect of the invention, the invention is a method of forming a double gate metal oxide semiconductor field effect transistor (MOSFET) from a semiconductor-on-insulator (SOI) wafer, the SOI wafer having a substrate with a buried oxide (BOX) layer disposed thereon and a semiconductor active layer disposed on the BOX layer. The method includes the steps of forming a semiconductor line, the step of forming the semiconductor line comprising the steps of (a) forming a dummy island on the active layer; (b) forming a sidewall spacer adjacent the dummy island; (c) removing the dummy island; (d) removing semiconductor material of the active layer left exposed by the sidewall spacer; and (e) removing the sidewall spacer; and forming a gate line disposed on the semiconductor line, the gate line overlapping the semiconductor line in at least two places.

BRIEF DESCRIPTION OF DRAWINGS

These and further features of the present invention will be apparent with reference to the following description and drawings, wherein.

DISCLOSURE OF INVENTION

Figure 1:
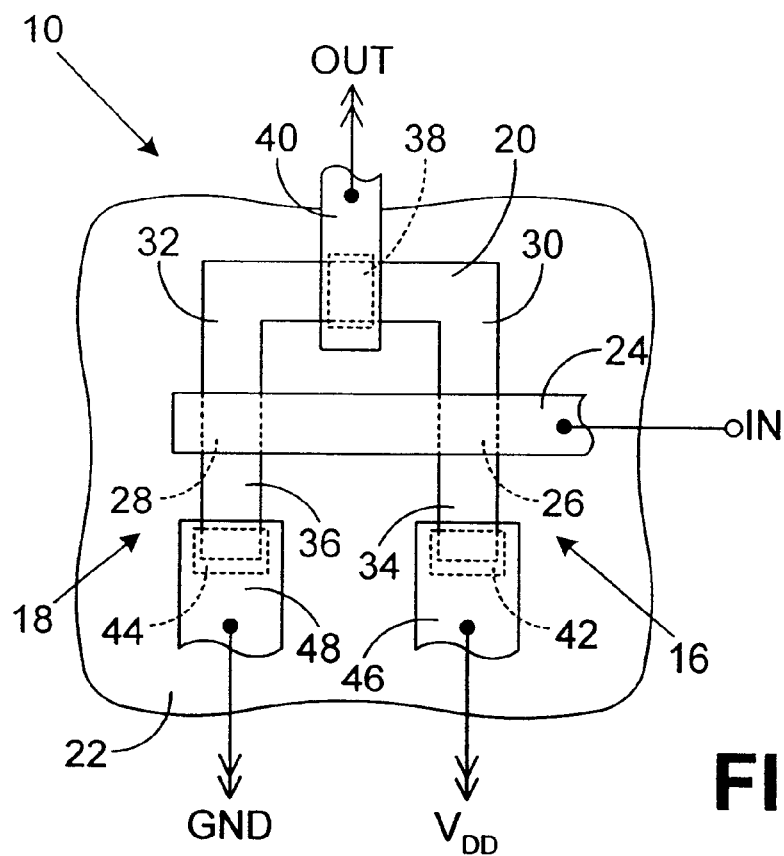
FIG. 1 is a top view of a double gate inverter according to the present invention.

In the detailed description which follows, identical components have been given the same reference numerals, regardless of whether they are shown in different embodiments of the present invention. To illustrate the present invention in a clear and concise manner, the drawings may not necessarily be to scale and certain features may be shown in somewhat schematic form.

Referring to FIG. 1, a top view of a semiconductor-on-insulator (SOI) device is illustrated. The SOI device is a logical circuit element, namely an inverter 10. Briefly, the inverter 10 is a compact complementary metal oxide semiconductor (CMOS) inverter comprised of a double gate partially-depleted metal oxide semiconductor field effect transistor (MOSFET). A method of fabricating the inverter 10 is described below. It is noted that the method is not limited to the fabrication of double gate MOSFETs or the inverter 10, but contains method steps which could be used for the fabrication of other devices, including, for example, single gate MOSFETs or interconnected MOSFETs forming a circuit or logical circuit element.

Figure 2:
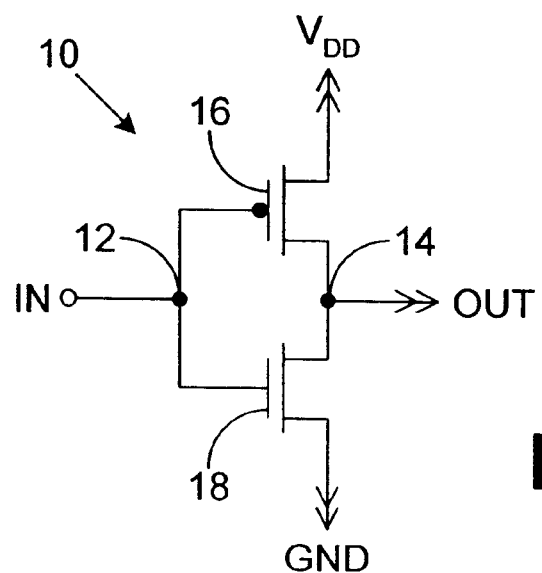
FIG. 2 is a schematic representation of the double gate inverter illustrated in FIG. 1.

With additional reference to FIG. 2, an electrical schematic of the inverter 10 is illustrated. The inverter 10 has an input 12 connected to receive a logical input signal IN (i.e., the input signal IN has a value of either low or high). The input 12 is connected to the gate of a dual gate MOSFET, which is schematically represented in FIG. 2 as the gates of two transistors 16, 18. The inverter 10 also has a output 14 for outputting a logical output signal OUT. The output signal OUT has a value of either low or high and is opposite of the input signal IN (i.e., when the input signal IN is low, the output signal OUT is high and vice versa). The output 14 is connected to the drain of the transistor 16 and the source of the transistor 18. The source of the transistor 16 is connected to a supply voltage, or VDD. The drain of the transistor 18 is connected to ground, or GND. It is noted that one of the transistors 16 or 18 is configured as a P-type device and the other is configured as an N-type device Referring back to FIG. 1, the inverter 10 is implemented in CMOS. To clearly illustrate the inverter 10 some material layers are not illustrated in FIG. 1. These layers and their fabrication will be apparent to one skilled in the art and will only be described briefly herein. As discussed in more detail below, with respect to the method of fabricating the inverter 10, the inverter 10 is fabricated on an SOI wafer having a semiconductor substrate and a buried oxide (BOX) layer disposed thereon. A semiconductor active layer is disposed on the BOX layer in which a non-linear semiconductor line 20 of the inverter 10 is fabricated. More particularly, semiconductor line 20 is made from the material of the active layer. The semiconductor line 20 is surrounded by isolation material 22, such as an oxide. In the illustrated embodiment, the active layer and the semiconductor line 20 are made of silicon.

A gate line 24 is layered above the semiconductor line 20 and, as viewed from above, overlaps the semiconductor line 20 in at least two places. The gate line 24 is operably coupled to receive the input signal IN. The gate line 24 is made from a suitable gate material, such as polysilicon. A gate oxide material is disposed between the gate line 24 and the semiconductor line 20 in the areas where the gate line 24 crosses over the semiconductor line 20. As a result, the gate line 24 forms the double gate portion of the double gate MOSFET inverter 10. Functionally, the gate line 24 serves as the gate of both the transistors 16 and 18. The portions of the semiconductor line 20 disposed under the gate line 24 respectively form a body region 26 of the transistor 16 and the body region 28 of the transistor 18. The portion of the semiconductor line 20 disposed between the body regions 26 and 28 form a drain 30 of transistor 16 and a source 32 of transistor 18. An intersection between the drain 30 and the source 32 functionally serves as the output 14 of the inverter 10. An end portion of the semiconductor line 20 adjacent the body region 26 forms a source 34 of transistor 16. An end portion of the semiconductor line 20 adjacent the body region 28 forms a drain 36 of transistor 18. It is noted that the semiconductor line 20 is selectively doped so that one of the transistors 16 or 18 is configured as a P-type device and the other is configured as an N-type device.

A contact opening 38 filled with conductive material is formed over the intersection of the drain 30 and the source 32. The contact opening 38 is connected to a metal line 40. As a result, the metal line 40 is operably coupled to connect the output 14 to a desired node (not shown). Similarly, filled contact openings 42 and 44 are formed over the source 24 and drain 36 to operably couple the supply voltage to the source 34 and ground to the drain 36 via metal lines 46 and 48 respectively. An appropriate contact opening and metal line can also be used to connect the gate line 24 to a desired node.

Figure 3:
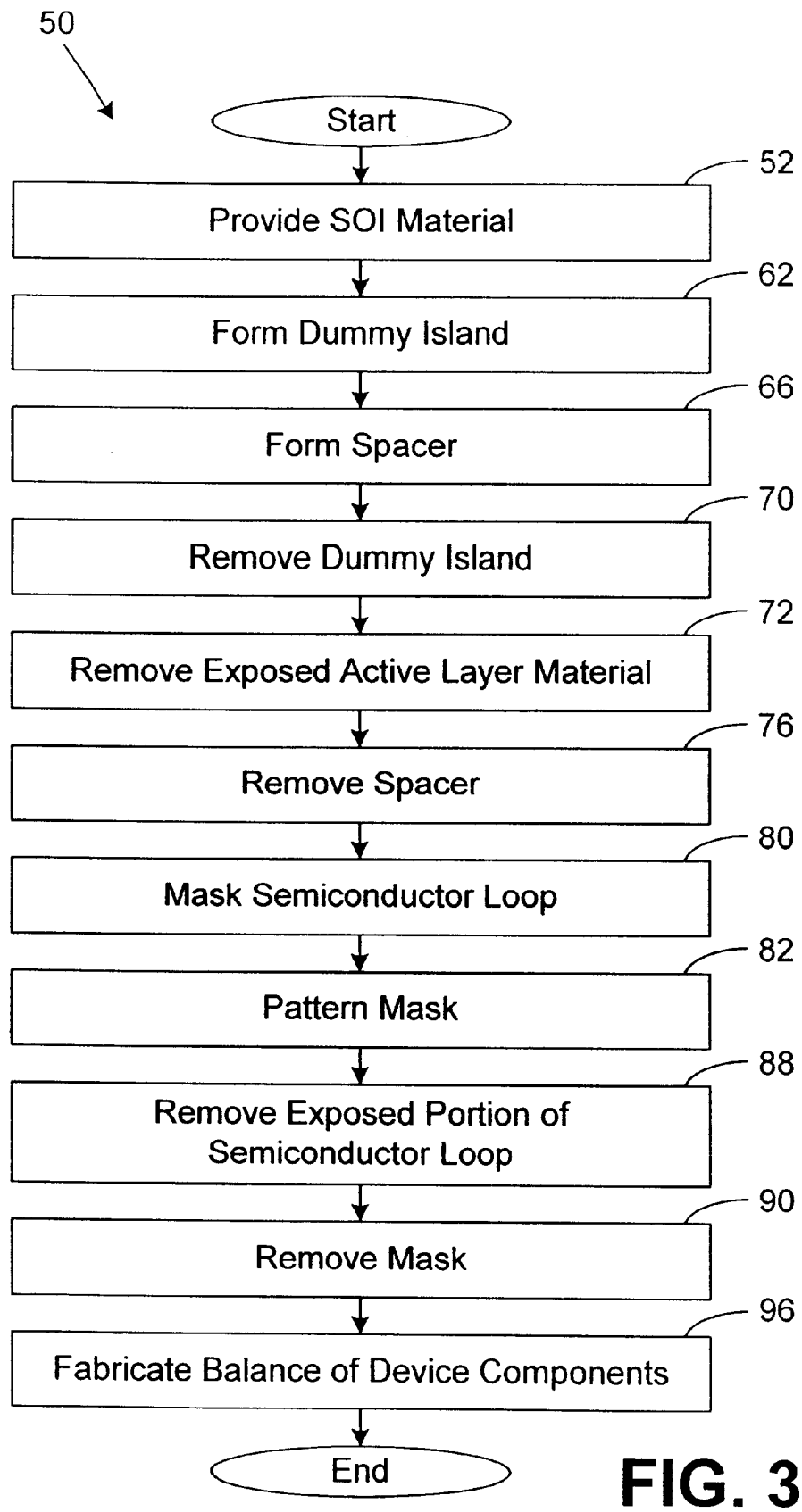
FIG. 3 is a flowchart of a method of fabricating the double gate inverter illustrated in FIG. 1.
Figure 4A:
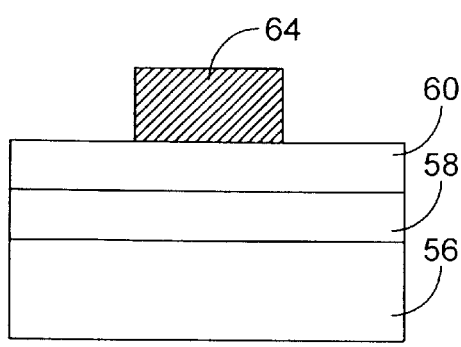
FIGS. 4A through 4L are a illustrations of the double gate inverter in various stages of fabrication.

Referring now to FIG. 3, a method 50 of fabricating the double gate inverter 10 illustrated in FIG. 1 is shown in flowchart format. With additional reference to FIG. 4A, the method 50 starts in step 52 by providing a wafer of SOI material 54. It is noted that FIG. 4A is a cross section taken along the line 4A in FIG. 4B. In the illustrated embodiment, the wafer 54 has a substrate 56 made from silicon. Alternatively, the substrate 56 can be made from another suitable semiconductor material, such as sapphire, germanium or silicon-germanium. Disposed on the substrate 56 is a BOX layer 58 made from a material such as silicon oxide ($SiO_2$) as shown in the illustrated embodiment. Disposed on the BOX layer 58 is an active layer 60. The active layer 60 is made from a semiconductor material, such as silicon as shown in the illustrated embodiment. Alternatively, the active layer 60 can be made from another suitable semiconductor material, for example, germanium or silicon-germanium. The wafer 54 is made using one of variety of known techniques, such as direct wafer bonding or a separated-by-implanted oxygen (SIMOX) technique.

Figure 4B:
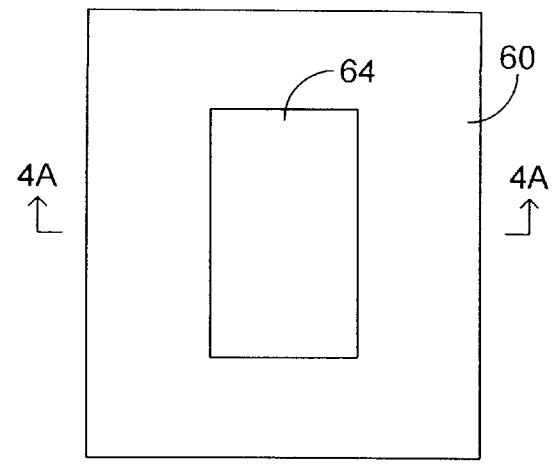

With continued reference to FIGS. 3 and 4A and additional reference to FIG. 4B, the method 50 continues in step 62 where a dummy island 64 is formed on the active layer 30. The dummy island 64 is made from silicon nitride ($Si_3N_4$) or other suitable material and can be formed by growing or depositing a layer of the dummy island material and patterning the dummy island material into a rectangle as illustrated. Some example alternative materials for the dummy island 64 include nitrides, oxides and amorphous silicon.

As will become apparent from the discussion below, a dummy island having a rectangular shape is used to form a rectangularly shaped semiconductor loop. However, the invention also contemplates forming a semiconductor line with rounded corners, an oval or arced shape, a triangular shape or other geometric shape by using a complimentary shaped dummy island. Therefore, the dummy island need not be rectangular. The exemplary rectangular dummy island 64 has a width (i.e., horizontal dimension as viewed in FIG. 4B) of about 100 nm to about 1000 nm, a length (i.e., vertical dimension as viewed in FIG. 4B) of about 100 nm to about 1000 nm and a height (i.e., vertical dimension as viewed in FIG. 4A) of about 50 nm to about 200 nm. The width of the dummy island 64 defines the spacing between two legs (reference numeral 92 in FIG. 4L) of the semiconductor line 20.

Figure 4C:
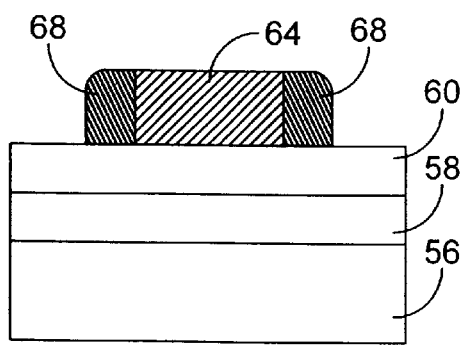
Figure 4D:
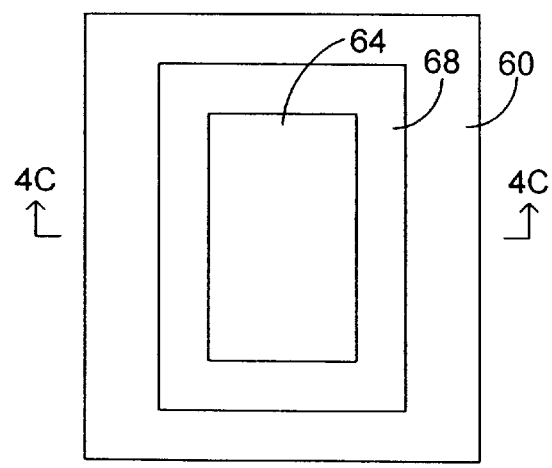

Referring now to FIGS. 3, 4C and 4D, the method 50 continues in step 66 by forming a sidewall spacer 68 around the perimeter of the dummy island 64. It is noted that FIG. 4C is a cross section taken along the line 4C in FIG. 4D. The sidewall spacer 68 is made from a material such as silicon oxide ($SiO_2$) and is formed using conventional techniques. If desired, the sidewall spacer 68 can be formed when other sidewall spacers are being formed for other devices located on the SOI wafer 54, such as sidewall spacers placed adjacent gate portions of other MOSFETs. The sidewall spacer 68 extends completely around the perimeter of the dummy island 64 and has a width (i.e., as measured from an inside edge of the sidewall spacer 68 to an outside edge of the sidewall spacer 68) of about 30 nm to about 100 nm.

Figure 4E:
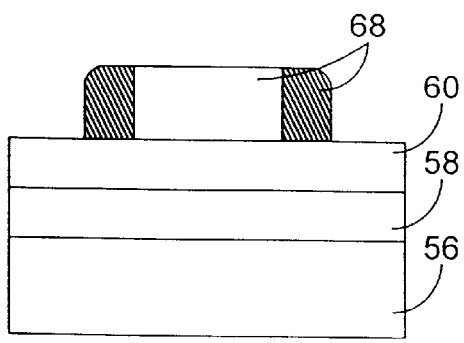

With additional reference to FIG. 4E, the dummy island 64 is removed in step 70. The dummy island 64 is removed by using a wet etch as is known in the art. After removing the dummy island 64, the sidewall spacer 68 remains. The resulting configuration of the sidewall spacer 64 is that of a frame, or a hollow member having a basic shape corresponding to the shape of the dummy island 64. As will be described below, the sidewall spacer 64 serves as a hard mask for the silicon of the active layer 60.

Figure 4F:
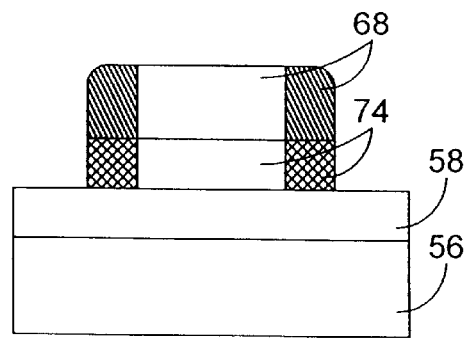

Next, in step 72 and as illustrated in FIG. 4F, the active layer 60 is etched to remove the silicon of the active layer except for the silicon masked by the presence of the sidewall spacer 68. The remaining silicon has the same general shape and size as the sidewall spacer 68. In the illustrated embodiment, the resulting silicon structure has the configuration of a rectangular loop, referred to herein as a semiconductor loop 74. It is noted that the semiconductor loop 74 need not be rectangular, continuous, or closed. The semiconductor loop 74 will generally have the same configuration as the sidewall spacer 68 which is, in turn, complementary to the size and shape of the dummy island 64. Therefore, as indicated above, if the dummy island 64 has a shape other than a rectangular shape, then the resulting semiconductor loop 74 will have a complementary shape which is other than rectangular.

Figure 4G:
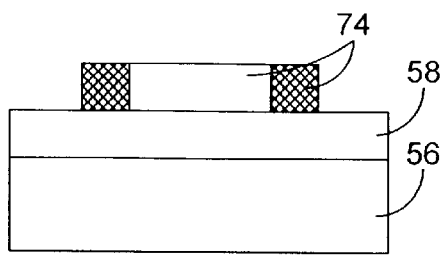
Figure 4H:
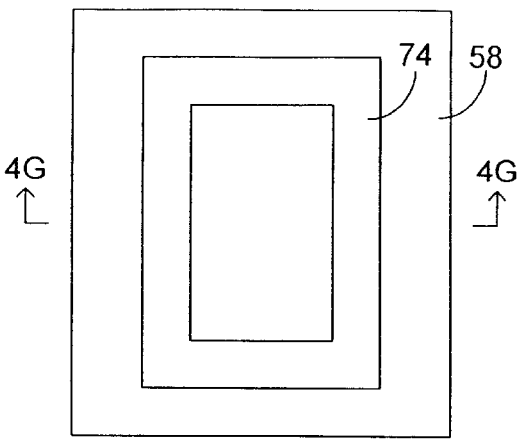

Next, in step 76 and as illustrated in FIGS. 4G and 4H, the sidewall spacer 68 is removed leaving exposed the semiconductor loop 74 disposed on the BOX layer 58. It is noted that FIG. 4G is a cross section taken along the line 4G in FIG. 4H. In the illustrated embodiment, the semiconductor loop 74 is rectangular, but, as indicated above, can have a different configuration.

Figure 4I:
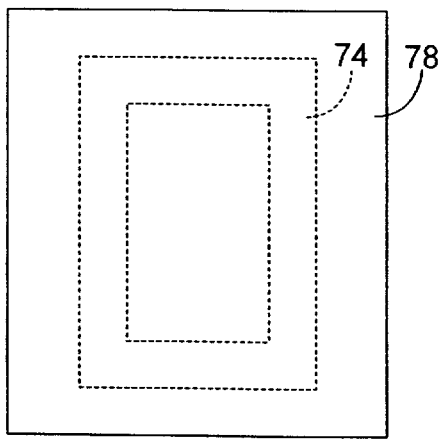
Figure 4J:
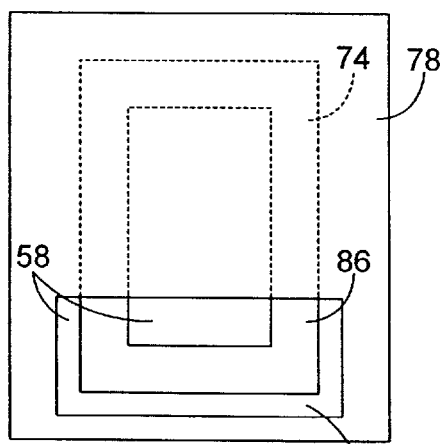

After the sidewall spacer 68 has been removed, the semiconductor loop 74 is covered with a mask 78 in step 80 and as illustrated in FIG. 4I. The mask 78 is a photoresist mask or other suitable mask as is known in the art. The mask 78 is patterned using photolithography in step 82 and as illustrated in FIG. 4J. More particularly, a window 84 is opened in the mask 78 to expose a portion 86 of the semiconductor loop 74. In the illustrated embodiment, the exposed portion 86 of the semiconductor loop 74 includes one side of the rectangular semiconductor loop 74 and can also include a portion of adjacent sides as illustrated. As will be described below, the exposed portion 86 of the semiconductor loop 74 will be removed. Therefore, one skilled in the art will appreciate that the window 84 to expose the exposed portion 86 can have any configuration desired by the device designer for removing a selected portion or portions of the semiconductor loop 74. In addition, the window 84 can be continuous or noncontinuous, (i.e., made up of multiple windows).

Figure 4K:
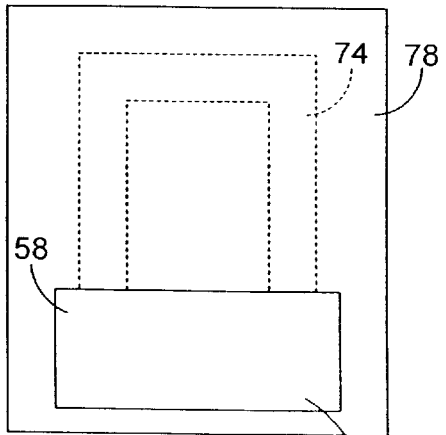

After the mask 78 has been patterned in step 82, the exposed portion 86 of the semiconductor loop 74 is removed in step 88. With additional reference to FIG. 4K, the exposed portion 86 is removed by etching, using the mask 78 to protect desired portions of the semiconductor loop 74.

Figure 4L:
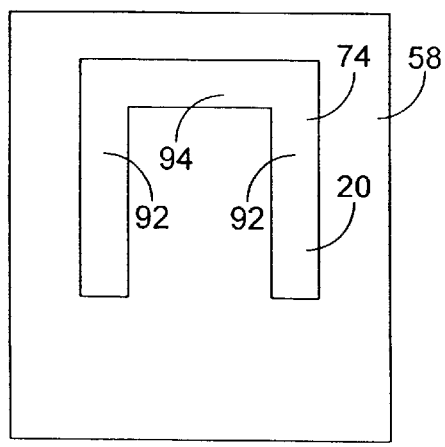

Next, in step 90 and as illustrated in FIG. 4L, the mask 78 is removed. Following removal of the mask 78, the remaining portion of the semiconductor loop 74 is exposed. This remaining portion of the semiconductor loop 74 results in the semiconductor line 20 used to fabricate the double gate MOSFET inverter 10 illustrated in FIG. 1. In the illustrated embodiment, the semiconductor line 20 has a "U-shaped" configuration having a pair of spaced apart legs 92 connected by a base 94. It is noted that the resulting semiconductor line 20 can be used in the fabrication of other devices other than the inverter 10. In addition, the shape and size of the semiconductor line 20 can be modified as desired by the designer by selecting the size and shape of the dummy island 64 and/or the size and shape of the window 84.

It is noted that the semiconductor line 20 can be doped as desired for the formation of P-type regions or N-type regions, especially in the body regions 26 and 28 to form P-type or N-type channels. The doping of the semiconductor line 20 can be carried out before the commencement of the method 50, during the method 50 or at a point after the completion of step 90.

Once the desired semiconductor line 20 is formed, the remainder of the inverter 10 is fabricated in step 96. The actions taken to construct the rest of the inverter 10 will be apparent to one skilled in the art and will only be mentioned briefly herein. Fabricating the rest of the inverter 10 includes forming the isolation material 22 surrounding the semiconductor line 20. A gate oxide layer is formed on the semiconductor line 20 and then patterned to form the gate oxide disposed between semiconductor line 20 and the gate line 24 as mentioned above. Next, the gate line 24 is formed using conventional techniques. If desired, the semiconductor line 20 can then be doped to form extensions adjacent the gate line 24 by using, for example, a lightly doped drain (LDD) technique. Following extension formation, spacers can be formed adjacent the gate line. The semiconductor line 20 is then doped with deep implants. Contacts, such as silicide regions, can be formed on semiconductor line 20 for the source 34 and the drain 36. An additional contact can be formed on the semiconductor line 20 at the intersection of the drain 30 and the source 31. If desired, a contact can be formed on the gate line 24. Next, isolation material is formed over the inverter 10 components and contact openings, including contact openings 38, 42 and 44, are opened in the isolation material. If desired, an additional contact opening can be opened to establish electrical connection to gate line 24. Finally, metal lines 40, 46, and 48 are formed, including a metal line for establishing electrical connection to the gate line 24, if desired.

The inverter 10 resulting from forming the semiconductor line 20 using the method 50 is relatively compact. In an example embodiment, the inverter 10 has an area of about 40,000 nm$^2$, or is about 200 nm by 200 nm.

Although particular embodiments of the invention have been described in detail, it is understood that the invention is not limited correspondingly in scope, but includes all changes, modifications and equivalents coming within the spirit and terms of the claims appended hereto.

For example, after step 70, the sidewall spacer 68 can be masked and etched to further define the size, shape and configuration of the sidewall spacer 68. The resulting size, shape and configuration of the semiconductor line 20 will correspond to the sidewall spacer 68. This gives the designer an additional way to pattern the semiconductor line 20 as desired and, in some cases, steps 80, 82, 88 and 90 can be omitted.

What is claimed is:

1. A method of forming a semiconductor line from a semiconductor-on-insulator (SOI) wafer, the SOI wafer having a substrate with a buried oxide (BOX) layer disposed thereon and a semiconductor active layer disposed on the BOX layer, comprising the steps of:

(a) forming a dummy island on the active layer;

(b) forming a sidewall spacer adjacent the dummy island;

(c) removing the dummy island;

(d) removing semiconductor material of the active layer left exposed by the sidewall spacer;

(e) removing the sidewall spacer;

(f) masking the semiconductor material remaining after step (e) with a mask;

(g) patterning the mask to expose a portion of the semiconductor material remaining after step (e);

(h) removing semiconductor material of the active layer left exposed after step (g); and (i) removing the mask.

2. The method according to claim 1, further comprising, before step (d), masking a portion of the sidewall spacer, removing an exposed portion of the sidewall spacer and removing mask material used to mask the sidewall spacer.

3. The method according to claim 1, wherein the dummy island has a rectangular shape.

4. The method according to claim 3, wherein the dummy island has a width of about 100 nm to about 1000 nm and a length of about 100 nm to about 1000 nm.

5. The method according to claim 3, wherein the sidewall spacer has a width measured from a first edge to a second edge of about 30 nm to about 100 nm.

6. The method according to claim 1, wherein the sidewall spacer has a width measured from a first edge to a second edge of about 30 nm to about 100 nm.

7. The method according to claim 1, wherein the dummy island is made of silicon nitride.

8. The method according to claim 1, wherein the sidewall spacer is made of silicon oxide.

9. The method according to claim 1, wherein the mask is made from a photoresist.

10. The method according to claim 1, wherein the active layer is silicon.

11. A method of forming a double gate metal oxide semiconductor field effect transistor (MOSFET) from a semiconductor-on-insulator (SOI) wafer, the SOI wafer having a substrate with a buried oxide (BOX) layer disposed thereon and a semiconductor active layer disposed on the BOX layer, comprising the steps of:

forming a semiconductor line, the step of forming the semiconductor line comprising the steps of:

(a) forming a dummy island on the active layer;
(b) forming a sidewall spacer adjacent the dummy island;
(c) removing the dummy island;
(d) removing semiconductor material of the active layer left exposed by the sidewall spacer; and
(e) removing the sidewall spacer; and forming a gate line disposed on the semiconductor line, the gate line overlapping the semiconductor line in at least two places.

12. The method according to claim 11, wherein the step of forming the semiconductor line further include the steps of:
(f) masking the semiconductor material remaining after step (e) with a mask;
(g) patterning the mask to expose a portion of the semiconductor material remaining after step (e);
(h) removing semiconductor material of the active layer left exposed after step (g); and
(i) removing the mask.

13. The method according to claim 12, wherein during the formation of the semiconductor line and before step (d), the step of forming the semiconductor line includes masking a portion of the sidewall spacer, removing an exposed portion of the sidewall spacer and removing mask material used to mask the sidewall spacer.

14. The method according to claim 11, wherein during the formation of the semiconductor line and before step (d), the step of forming the semiconductor line includes masking a portion of the sidewall spacer, removing an exposed portion of the sidewall spacer and removing mask material used to mask the sidewall spacer.

15. The method according to claim 11, wherein the dummy island has a rectangular shape.

16. The method according to claim 15, wherein the dummy island has a width of about 100 nm to about 1000 nm and a length of about 100 nm to about 1000 nm.

17. The method according to claim 15, wherein the sidewall spacer has a width measured from a first edge to a second edge of about 30 nm to about 100 nm.

18. The method according to claim 11, wherein the sidewall spacer has a width measured from a first edge to a second edge of about 30 nm to about 100 nm.

19. The method according to claim 11, wherein the active layer is silicon.

20. The method according to claim 11, wherein the double gate MOSFET is configured as an inverter.

* * * * *

UNITED STATES PATENT AND TRADEMARK OFFICE
CERTIFICATE OF CORRECTION

PATENT NO. : 6,451,656 B1
DATED : September 17, 2002
INVENTOR(S) : Yu et al.

It is certified that error appears in the above-identified patent and that said Letters Patent is hereby corrected as shown below:

Column 4,
Line 62, replace "FIG. 41" with -- FIG. 4I --.

Signed and Sealed this

Twenty-eighth Day of January, 2003

JAMES E. ROGAN
*Director of the United States Patent and Trademark Office*